(12) United States Patent
Vishin

(10) Patent No.: US 6,178,479 B1
(45) Date of Patent: Jan. 23, 2001

(54) CYCLE-SKIPPING DRAM FOR POWER SAVING

(75) Inventor: Sanjay Vishin, Sunnyvale, CA (US)

(73) Assignee: nBand Communications, Sunnyvale, CA (US)

(*) Notice: Under 35 U.S.C. 154(b), the term of this patent shall be extended for 0 days.

(21) Appl. No.: 09/255,040

(22) Filed: Feb. 22, 1999

(51) Int. Cl.[7] .......................... G06F 12/00; G11C 11/406
(52) U.S. Cl. .......................... 711/106; 711/143; 365/222; 365/227
(58) Field of Search .......................... 365/45, 222, 227; 711/106, 143

(56) References Cited

U.S. PATENT DOCUMENTS

| | | | |
|---|---|---|---|
| 5,283,885 | * | 2/1994 | Hollerbauer .......................... 711/106 |
| 5,656,528 | * | 8/1997 | Wahlstrom .......................... 438/152 |
| 6,028,805 | * | 2/2000 | Higuchi .......................... 365/222 |
| 6,094,705 | * | 7/2000 | Song .......................... 711/106 |

OTHER PUBLICATIONS

Katsutaka Kimura, et al., "Power Reduction Techniques in Megabit DRAM's," IEEE Journal of Solid–State Circuits, vol. SC–21, No. 3, Jun. 1986, pp. 381–388.

Kiyoo Itoh, et al., "Trends in Low–Power RAM Circuit Technologies", Proceedings of the IEEE, vol. 83, No. 4, Apr. 1995, pp. 524–543.

* cited by examiner

Primary Examiner—David L. Robertson
(74) Attorney, Agent, or Firm—Michael A. Glenn

(57) ABSTRACT

A DRAM memory saves on the overall power consumed by the whole device by skipping unnecessary read, write, and refresh cycles of the internal memory core. Because each such cycle costs power, skipped cycles save power. Specifically, read cycles are not always automatically followed by write-back cycles that restore the read-data, e.g. due to the destructive-read nature of the DRAM. Such write-back cycles are only allowed when they can be postponed no longer, and the data written are actually used sometime later. Data that needs only to be read back once, and that have thereby served their purpose, are not written-back. Simple refresh cycles involving unused rows, or rows that have been destructively read and not yet written-back, are skipped and not refreshed. Data rows that are read from the memory core are held in the peripheral circuits in a way that simulates a cache. All the external byte and bit accesses that can be supported by the whole row in cache are serviced without read or write cycles to the memory core.

20 Claims, 4 Drawing Sheets

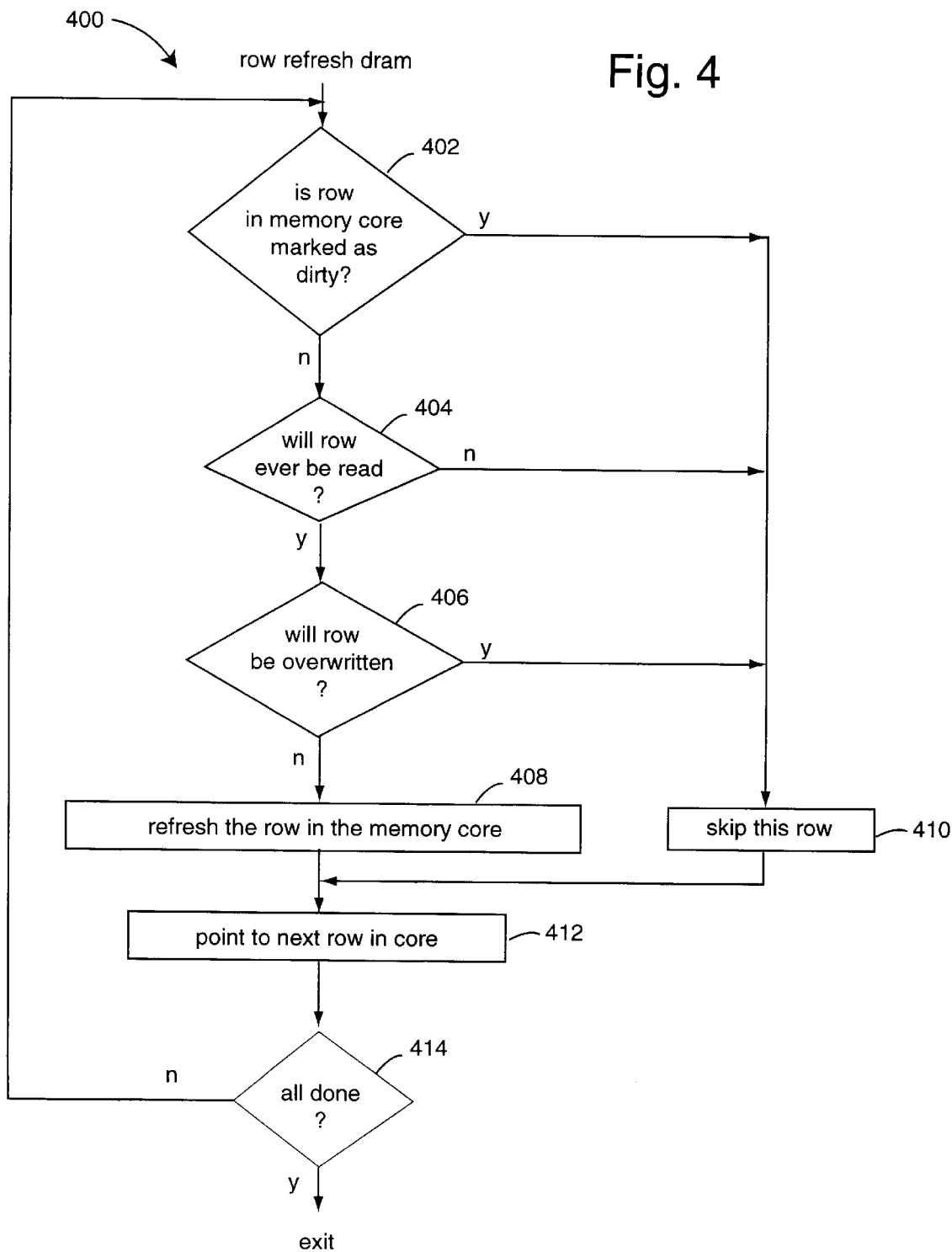

CYCLE-SKIPPING DRAM FOR POWER SAVING

BACKGROUND OF THE INVENTION

1. Technical Field

The invention relates to dynamic random access memories (DRAMs) used in computer systems. More particularly the invention relates to methods and devices for reducing the power consumed by DRAMs to benefit portable, battery powered equipment.

2. Description of the Prior Art

Dynamic random access memories (DRAM's) are now the main type of memory devise used in computer systems, at least in part, because their one-transistor per memory cell construction permits a maximum of memory storage to be designed onto a chip. Each memory cell uses a capacitor to store a voltage that represents a digital bit value. Because the capacitors are very small, a refresh must be periodically performed to rewrite each bit. Otherwise, the information written in the memory is lost due to drifts and leakage that occur in such circuits. Most such DRAM's use circuits that unavoidably destroy the data in each memory cell when it is read out. Thus, a write-back cycle is needed to return the data to its original condition for other accesses.

It has been common practice in DRAM design to organize the memory cells into equal numbers of rows and columns, forming a square area on the chip die. A 1M-bit DRAM is therefore roughly organized as 1K-by-1K, depending on the height and width of each cell. Access to such memory involves selecting whole rows where only a portion of the whole number of columns are manipulated at any one access. Row decoders are used to select which row in a memory core is to be accessed and column decoders are used to select the columns that match the system memory address. Sense amplifiers and latches are used to read and hold the data values in peripheral circuits, because the way the data are stored in the individual memory cells is incompatible with the external logic levels.

A principle reason that DRAM designers have been interested in reducing the power consumption of devices is to keep the heat dissipation to reasonable levels. With more than a million bits per DRAM chip now common, whatever power is dissipated in each memory cell is multiplied by a million or more for the whole chip. For example, Katsutaka Kimura, et al., describe various power reduction techniques that are conventional in DRAM design in their article, *Power Reduction Techniques in Megabit DRAM's*, IEEE Journal of Solid-State Circuits, Vol. SC-21, No. 3, pp. 381–388 (June 1986). They seem to settle on using CMOS technology with half-Vcc precharge as their preferred solution for DRAMs over 1M-bit.

Another similar discussion is by Kiyoo Itoh, et al. in *Trends in Low-Power RAM Circuit Technologies*, Proceedings of the IEEE, Vol. 83, No. 4, pp. 524–543 (April 1995). This article describes how lowering RAM memory power consumption can be helpful in portable battery powered equipment. The focus is on ways the charging capacitance, operating voltage, and DC static current can all be reduced to save on the overall power consumed by a RAM. A preferred method here for reducing power consumption is to use partial activation of multi-divided data-line and shared I/O circuits.

The popularity of portable computers and devices powered by batteries has been increasing. But batteries with very high energy storage capability continue to elude designers. So the answer to longer operational battery life is to draw less power for a given application. Thus, even in DRAMs where heat dissipation is not a problem, it is nevertheless important to reduce power consumption to extend operating time for portable systems because such a large portion of the overall system power is consumed by the DRAMs.

SUMMARY OF THE INVENTION

A DRAM memory embodiment of the invention saves on the overall power consumed by the whole device by skipping unnecessary read, write, and refresh cycles of the internal memory core. Because each such cycle costs power, skipped cycles save power. Specifically, read cycles are not always automatically followed by write-back cycles that restore the read-data, e.g., due to the destructive-read nature of the DRAM. Such write-back cycles are only allowed when they can be postponed no longer, and the data written are actually used sometime later. Data that are read back only once, and that have thereby served their purpose, are not written-back. Simple refresh cycles involving unused rows or rows that have been destructively read and not yet written-back are skipped and not refreshed. Data rows that are read from the memory core are held in the peripheral circuits in a way that simulates a cache. All the external byte and bit accesses that can be supported by the whole row in cache are serviced without read or write cycles to the memory core.

BRIEF DESCRIPTION OF THE DRAWINGS

FIG. 4 is a flow chart of a row refresh access method in accordance with the invention.

DETAILED DESCRIPTION OF THE INVENTION

Figure 1:
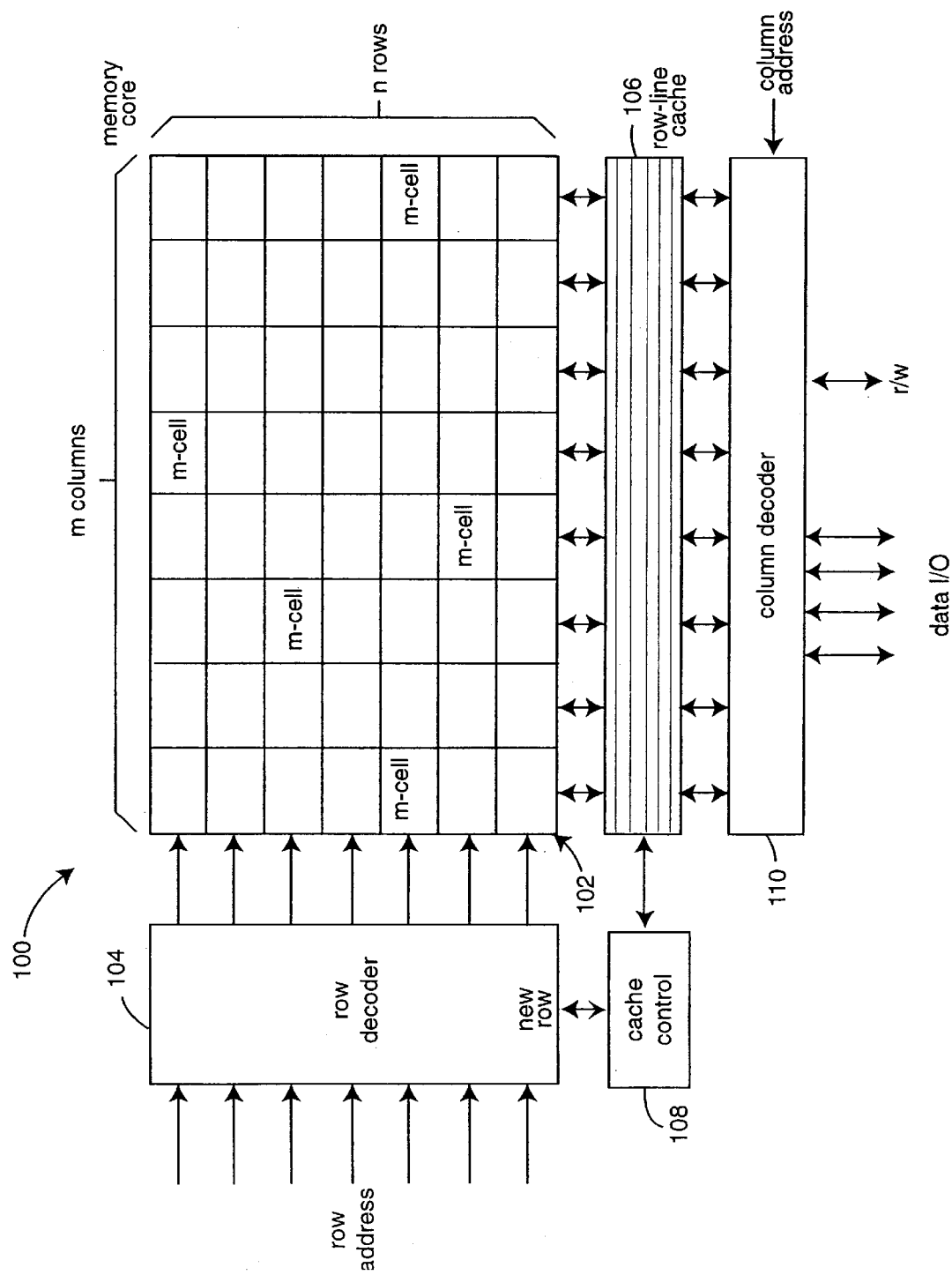
FIG. 1 is a functional block diagram of a dynamic random access memory (DRAM) in accordance with the invention.

FIG. 1 depicts a DRAM system 100 in a preferred embodiment of the invention. A core of memory cells ("core memory") 102 is organized with m-number of columns and n-number of rows. Preferably, the number of columns and the number of rows (m>n) is such that the physical layout is very wide when contrasted with the height. In prior art DRAM's, the width and height are the same so the layout approximates a square. The wide aspect ratio is especially possible where the entire DRAM system 100 is embedded on a single semiconductor chip in proximity to a central processing unit (CPU), and so such designs are preferred and derive the best benefits of the invention. Specifically, reduced power consumption can be realized by using very wide DRAM rows. It is intended that the DRAM 100 be embedded on a larger microcomputer or digital signal processor chip so the access between the DRAM 100 and CPUs are not affected by packaging pin limitations. A row address decoder 104 converts the upper bits of a memory access address to a one-of-n selection that activates one row of memory cells for read, write, or refresh accesses.

A set of eight fully-associated row-line caches in a cache 106 are used. These are preferably implemented in static random access memory (SRAM) and can be electronically rotated. Particular applications may not need eight full rows, as few as two or three full rows have provided good results in special cases.

The number of rows to use in the row-line cache 106 is empirically determined. Each row-line cache maintains a "dirty" bit (D) and a "valid" bit (V) that are used to describe the contents. In a "read-once" instance, D=0 and V=1. In a "write to destroy" instance, D=1 and V=1. The cache 106 further includes information identifying which rows of memory cells in the memory core 102 have been transferred into the row-line cache. Data can be read from an activated row in the memory array to a row-line cache 106, and in such case the data left behind in the activated row become corrupted. Such phenomenon is known as "destructive read." Data can also be written to the activated row a whole line at a time from the row-line cache 106.

Conventional DRAM devices necessarily follow every read access with a write-back cycle to restore the data in the row accessed. The write-back cycle is needed because the read operation is destructive in most DRAMs. Each of the read accesses and the write-back cycles consumes a pulse of power that must come from the battery. This, of course, is assuming that the DRAM 100 is used in battery operated portable equipment, thus making the power consumed in the memory a critical issue.

In DRAM embodiments of the invention, data that are to be read, modified, and written back by the processor are identified, and the DRAM is not allowed to perform an automatic write-back cycle after the first read access. Such write-back data represents the old data before they are modified by the processor.

A cache control 108 receives a signal from the row decoder 104 indicating that a new row is being accessed. The cache control 108 must then decide if it has a row of data in it that must to be written back to the memory core 102 before it downloads a new row. A dirty flag is used to mark a row that has been destructively read but not yet written back. Such dirty flags are shown in FIG. 1 as being included in the memory core 102.

The very wide row of data held in the row line cache 106 is selectively accessed by a column decoder 110. Any bit, byte, word, double-word, or even the whole row can be selected. An external CPU can read or write the involved bits without affecting the non-involved bits.

Figure 2:
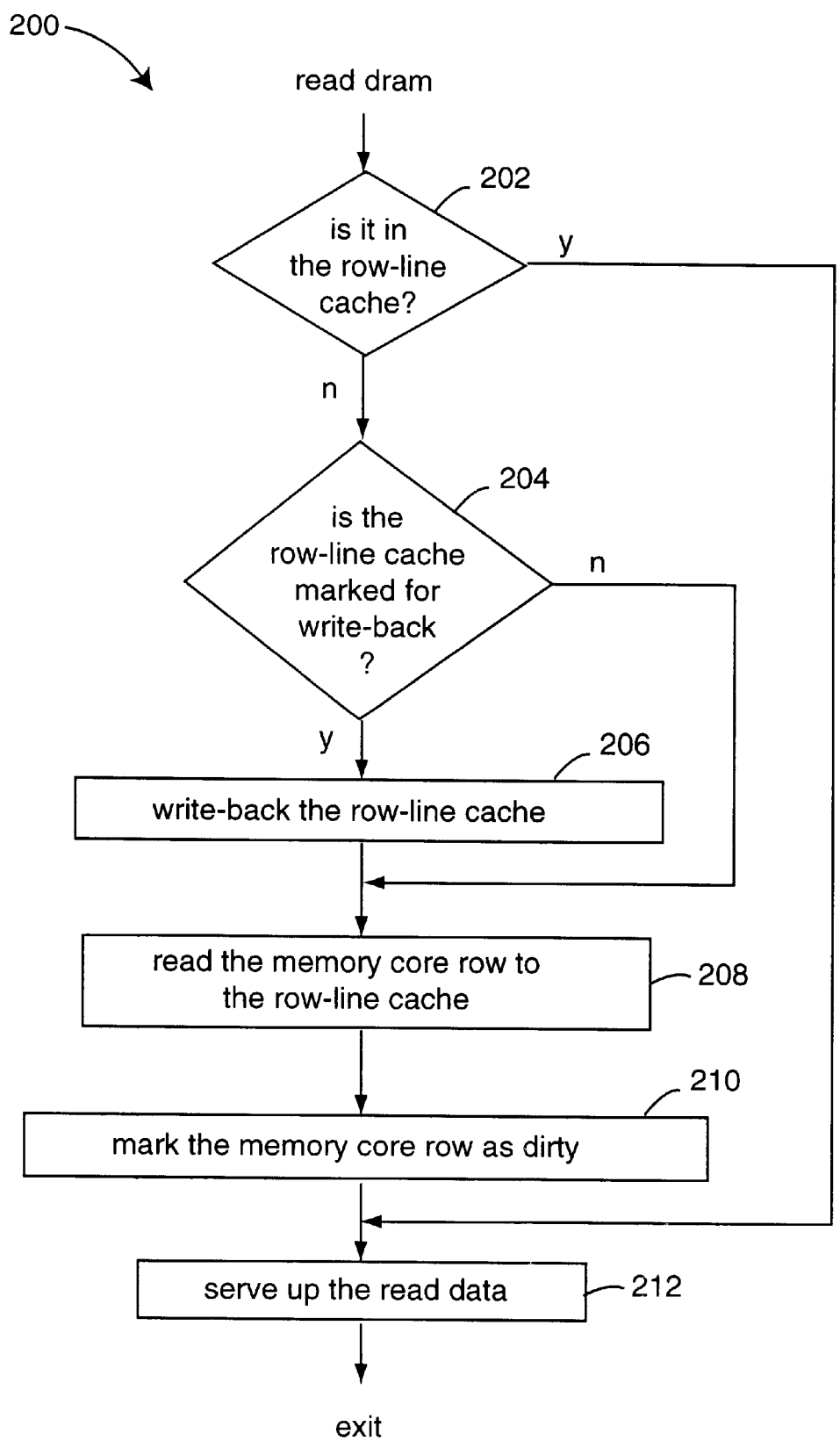
FIG. 2 is a flow chart of a read access method in accordance with the invention.

FIG. 2 represents a read-DRAM method 200 in a preferred embodiment of the invention. The read-DRAM method 200 is preferably implemented with the hardware of DRAM 100 (FIG. 1). Any CPU read access (202) requires a determination if the read access involves data that are already in the row cache. Besides the dirty and valid bits described, a conventional tag memory common to cache memories could be used to assist this decision. If the data to be read are not in the row-line cache (204), a determination is made if the data currently in the row-line cache must be written-back or flushed to the memory core before new data are downloaded to it. If so, the write-back is performed (206).

A pulse of power is used from the battery power supply during the write-back. To save power these cycles are kept to a minimum. The row of data is then read from the memory core to the row-line cache (208). The row in the memory core is marked as being dirty (210) because an unavoidable destructive read has corrupted the row in the memory core. A pulse of power is used from the battery power supply during the memory core read access. To save power, these cycles too are kept to a minimum.

The system can then deliver the requested data from the row-line cache in bits, bytes, words, double-words, or even the whole row (212). If the requested data are in the row line cache (202), the process delivers the requested data immediately (212). If the row in the memory core is not marked for write-back in a previously accessed row then in cache (204), then the row of data can be read from the memory core to the row-line cache (208).

Figure 3:
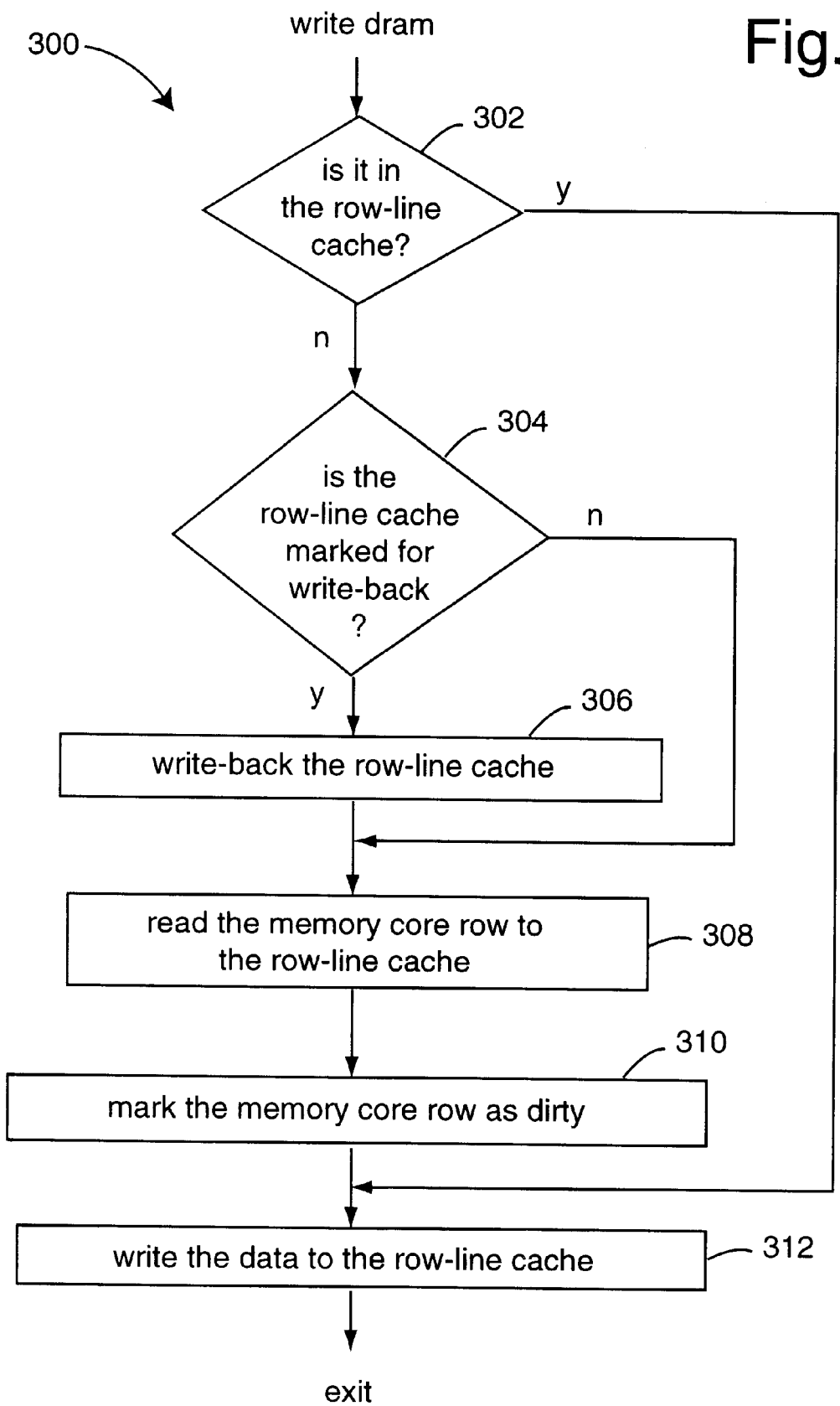
FIG. 3 is a flow chart of a write access method in accordance with the invention.

FIG. 3 represents a write-DRAM method 300 in a preferred embodiment of the invention. The write-DRAM method 300 is preferably implemented with the hardware of DRAM 100 (FIG. 1). Any CPU write access causes a determination (302) if the write access involves data that are already in the row cache. If not, the row in the memory core must be brought to the row-line cache first. If another data row is already in the row-line cache, a few preliminary steps must be taken. A determination must be made (304) if the data in the row-line cache are marked for a write-back to the memory core, e.g., the dirty and valid bits are inspected. If so, the write-back is performed (306). Now the row-line cache is free for new uses. The row in the memory core that is to be written is read (308), and the row is placed in the row-line cache. The row in the memory core is marked as dirty (310) because the transfer operation necessarily corrupts the row data left behind in the memory core. The data are allowed to be written from the CPU to affect selectively the bits in the row-line cache that correspond to the system address and a bit/byte/word/row mode (312). If the affected row to be written is already in the row-line cache, the method proceeds directly to the write-back step (312). If the data in the row-line cache (304) are not marked for write-back, then that cycle can be skipped and the process can proceed directly to reading the row in the memory core (308).

A row refresh method 400 of the invention is illustrated in FIG. 4. The object of the method is to conserve power by refreshing only those rows in the DRAM that need to be refreshed. Whole rows of data are never read, are overwritten, or are read but discarded can be skipped. A determination is made (402) if the row to be refreshed is dirty. If not, a determination is made (404) if the row is ever to be read. An application program running on the CPU could reasonably know this and be able to communicate this information to the DRAM. A determination is made (406) if the row in the DRAM memory core is to be overwritten, e.g. without first being read. If not, the row is refreshed (408) by reading it, amplifying it, and writing it back. A refresh cycle that simply does this is conventional. The decision to skip the refresh based on some intelligence and to save power is a key point of the invention. The current row is skipped (310) in the memory core and the method proceeds to the next row if there is no need to perform the refresh cycle. A refresh controller is then pointed to the next row in the DRAM memory core (412). A determination is made (414) if all the rows in the DRAM memory core have been refreshed. If not, the method (402–412) is repeated.

Although the invention is described herein with reference to the preferred embodiment, one skilled in the art will readily appreciate that other applications may be substituted for those set forth herein without departing from the spirit and scope of the present invention. Accordingly, the invention should only be limited by the Claims included below.

What is claimed is:

1. A dynamic random access memory (DRAM), comprising:

a memory core organized into rows and columns of memory cells;

a row line cache of static random access memory (SRAM) connected to said memory core and providing for temporary and column-addressable storage of at least two entire rows of data transferred to and from a corresponding set of said memory cells in a row of the memory core;

wherein, a transfer of data from said memory cells in a row of the memory core to the row line cache is not automatically followed by a write-back of the row line cache to the memory core.

2. The DRAM of claim 1, further comprising:

a dirty bit providing for the marking of a row of memory cells in the memory core whenever said row has not been written-back after a destructive-read cycle.

3. The DRAM of claim 1, further comprising:

an identifying information on which row of memory cells in the memory core has last been transferred into the row line cache.

4. The DRAM of claim 1, further comprising:

a controller providing for an external write operation to modify only the row-line cache if a tag memory indicates any row of data held in temporary storage includes the row in the memory core to-be-written.

5. The DRAM of claim 1, wherein:

the controller further provides for a row flush of the row line cache to a corresponding row in the memory core if an external write operation is currently addressing a different row of data.

6. The DRAM of claim 1, wherein:

said number of columns is such that their combined physical dimensional width in a semiconductor chip layout exceeds the physical dimension height of the number of rows used, and the entire DRAM is embedded on a single semiconductor chip in proximity to a central processing unit (CPU).

7. The DRAM of claim 1, further comprising:

a controller providing for no write-back of any data in the row line cache to the memory core if such data will never be read.

8. The DRAM of claim 1, further comprising:

a controller providing for no write-back of any data in the row line cache to the memory core if such data will be ultimately overwritten.

9. The DRAM of claim 1, further comprising:

a controller providing for no write-back of any data in the row line cache to the memory core if such data will be read but then dumped.

10. The DRAM of claim 1, further comprising:

a controller providing for no refresh of any data in the memory core if a corresponding row containing such data is marked as dirty, is never read, is ultimately overwritten, or if such data is to be read but then dumped.

11. A method for reading data stored in a dynamic random access memory (DRAM), wherein the DRAM has a memory core organized into rows and columns of memory cells, and any row line cache of static RAM connected to said memory core and providing for temporary and column-addressable storage of an entire row of data transferred to and from a corresponding set of said memory cells in any row of the memory core, and a transfer of data from said memory cells in any row of the memory core to the row line cache is not automatically followed by a write-back of the row line cache to the memory core, the method comprising the steps of:

for any CPU read access, deciding if a read access involves data that is already in any row line cache;

if said data to be read is not in said row-line cache, deciding if said data currently in said row-line cache needs to be written-back or flushed to said memory core before new data is downloaded to it;

if so, performing said write-back wherein a pulse of power will be used from a battery power supply during said write-back, and to save power such cycles are kept to a minimum;

reading said row of data from said memory core to said row-line cache, wherein a pulse of power is used from said battery power supply during said memory core read access, and to save power these cycles too are kept to a minimum;

marking said row in said memory core as being dirty due to an unavoidable destructive read that corrupted said row in said memory core; and serving up said requested data.

12. The DRAM read method of claim 11, wherein:

the step of serving-up includes serving up said requested data from said row-line cache in bits, bytes, words, double-words, or whole said row.

13. The DRAM read method of claim 11, wherein:

the first step of deciding is such that if said requested data is in said row line cache, said process can jump directly to the step of serving-up.

14. The DRAM read method of claim 11, wherein:

the second step of deciding is such that if said row in said memory core is not marked for write-back in a previously accessed row then in cache, then said process can proceed directly to the step of reading said row of data from said memory core.

15. A method for writing data to be stored in a dynamic random access memory (DRAM), wherein the DRAM has a memory core organized into rows and columns of memory cells, and any row line cache of static RAM connected to said memory core and providing for temporary and column-addressable storage of an entire row of data transferred to and from a corresponding set of said memory cells in any row of the memory core, and a transfer of data from said memory cells in any row of the memory core to the row line cache is not automatically followed by a write-back of the row line cache to the memory core, the method comprising the steps of:

for any CPU write access, deciding if a write access involves data that is already in any row cache;

if not, transferring any row in a memory core to said row-line cache first;

deciding if said data in said row-line cache is marked for a write-back to said memory core;

if so, doing said write-back so said row-line cache is free for new uses;

reading said row in said memory core that is to be written, and placing it in said row-line cache;

marking said row in said memory core as dirty because said transfer operation necessarily corrupted said row data left behind in said memory core; and allowing said data to be written from said CPU to selectively affect said bits in said row-line cache that correspond to a system address and a bit/byte/word/row mode.

16. The method for writing data to be stored in a DRAM of claim 15, wherein:

the steps are such that if said affected row to be written is already in said row-line cache, then proceeding directly to the step of allowing, and if said data in said row-line cache is not marked for write-back, then skipping that cycle and proceeding directly to the step of reading said row.

17. A method for refreshing data in a dynamic random access memory (DRAM), wherein the DRAM has a memory core organized into rows and columns of memory cells, and any row line cache of static RAM connected to said memory core and providing for temporary and column-addressable storage of an entire row of data transferred to and from a corresponding set of said memory cells in any row of the memory core, and a transfer of data from said memory cells in any row of the memory core to the row line cache is not automatically followed by a write-back of the row line cache to the memory core, the method comprising the steps of:

deciding if any row in a DRAM memory core to be refreshed is "dirty";

if not, deciding if said row is ever read;

if not, deciding if said row is overwritten without first being read; and if not, refreshing said row by reading it, amplifying it, and writing it back.

18. The method for refreshing data in a DRAM of claim 17, wherein:

the steps of deciding to skip any refresh is based on intelligence provided by a central processor unit.

19. The method for refreshing data in a DRAM of claim 17, further comprising the step of:

skipping a refresh of a current row in said memory core and proceeding to do a refresh of a next row, wherein whole rows of data that are never read, are overwritten, or are to be read but discarded can be skipped and power is conserved by refreshing only those rows in said DRAM that must be refreshed to maintain valid data that are actually used later.

20. A method of operating a dynamic random access memory (DRAM), wherein the DRAM has a memory core organized into rows and columns of memory cells, and any row line cache of static RAM connected to said memory core and providing for temporary and column-addressable storage of an entire row of data transferred to and from a corresponding set of said memory cells in any row of the memory core, and a transfer of data from said memory cells in any row of the memory core to the row line cache is not automatically followed by a write-back of the row line cache to the memory core, the method comprising the steps of:

for any CPU read access, deciding if a read access involves data that is already in any row line cache;

if said data to be read is not in said row-line cache, deciding if said data currently in said row-line cache needs to be written-back or flushed to said memory core before new data is downloaded to it;

if so, performing said write-back wherein a pulse of power will be used from a battery power supply during said write-back, and to save power such cycles are kept to a minimum;

reading said row of data from said memory core to said row-line cache, wherein a pulse of power is used from said battery power supply during said memory core read access, and to save power these cycles too are kept to a minimum;

marking said row in said memory core as being dirty due to an unavoidable destructive read that corrupted said row in said memory core;

serving up said requested data;

for any CPU write access, deciding if a write access involves data that is already in any row cache if not, transferring any row in a memory core to said row-line cache first;

deciding if said data in said row-line cache is marked for a write-back to said memory core;

if so, doing said write-back so said row-line cache is free for new uses;

reading said row in said memory core that is to be written, and placing it in said row-line cache;

marking said row in said memory core as dirty because said transfer operation necessarily corrupted said row data left behind in said memory core;

allowing said data to be written from said CPU to selectively affect said bits in said row-line cache that correspond to a system address and a bit/byte/word/row mode;

deciding if any row in a DRAM memory core to be refreshed is dirty;

if not, deciding if said row is ever read;

if not, deciding if said row is overwritten without first being read; and if not, refreshing said row by reading it, amplifying it, and writing it back.

* * * * *